United States Patent
Coyne et al.

(10) Patent No.: US 10,043,792 B2
(45) Date of Patent: Aug. 7, 2018

(54) ELECTROSTATIC PROTECTION DEVICE

(71) Applicant: ANALOG DEVICES, INC., Norwood, MA (US)

(72) Inventors: Edward John Coyne, Limerick (IE); Patrick Martin McGuinness, Limerick (IE); Paul Malachy Daly, Limerick (IE); Bernard Patrick Stenson, Limerick (IE); David J. Clarke, Limerick (IE); Andrew David Bain, Limerick (IE); William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/346,527

(22) Filed: Nov. 8, 2016

(65) Prior Publication Data

US 2017/0117266 A1  Apr. 27, 2017

Related U.S. Application Data

(63) Continuation of application No. 12/612,609, filed on Nov. 4, 2009, now Pat. No. 9,520,486.

(51) Int. Cl.
  *H01L 21/331*  (2006.01)
  *H01L 23/60*  (2006.01)
  (Continued)

(52) U.S. Cl.
  CPC ...... *H01L 27/0259* (2013.01); *H01L 29/0692* (2013.01); *H01L 29/0821* (2013.01);
  (Continued)

(58) Field of Classification Search
  CPC ... H01L 21/331; H01L 23/60; H01L 29/0692; H01L 29/0821; H01L 29/402; H01L 29/6625; H01L 29/735
  (Continued)

(56) References Cited

U.S. PATENT DOCUMENTS 3,436,667 A  4/1969  Leonard
3,660,687 A  5/1972  Sahm et al.
(Continued)

FOREIGN PATENT DOCUMENTS

DE  10 2007 040 875 A1  3/2009
EP  0 168 678 A2  1/1986
(Continued)

OTHER PUBLICATIONS

Anderson et al., ESD Protection under Wire Bonding Pads, EOS/ESD Symposium 99-88, pp. 2A.4.1-2A.4.7 (1999).
(Continued)

*Primary Examiner* — Lynne Gurley
*Assistant Examiner* — Vernon P Webb
(74) *Attorney, Agent, or Firm* — Knobbe, Martens, Olson & Bear, LLP

(57) ABSTRACT

An apparatus including an electrostatic discharge (ESD) protection device comprising a semiconductor having first, second and third regions arranged to form a transistor, wherein the first region is doped with a first impurity of a first conductivity type and is separated from the second region which is doped with a second impurity of a second conductivity type opposite the first type, and wherein a dimensional constraint of the regions defines an operational threshold of the ESD protection device. In one example, the separation between a collector and an emitter of a bipolar transistor defines a trigger voltage to cause the electrostatic discharge protection device to become conducting. In another example, a width of a bipolar transistor base controls a holding voltage of the electrostatic discharge protection device.

26 Claims, 12 Drawing Sheets

(51) Int. Cl.
   *H01L 27/02* (2006.01)
   *H01L 29/66* (2006.01)
   *H01L 29/735* (2006.01)
   *H01L 29/06* (2006.01)
   *H01L 29/08* (2006.01)
   *H01L 29/40* (2006.01)

(52) U.S. Cl.
   CPC ........ *H01L 29/402* (2013.01); *H01L 29/6625* (2013.01); *H01L 29/735* (2013.01)

(58) Field of Classification Search
   USPC ................... 257/173, 328, E21.37, E29.255
   See application file for complete search history.

(56) References Cited

U.S. PATENT DOCUMENTS

| | | |
|---|---|---|
| 3,694,670 A | 9/1972 | Marzolf |
| 3,764,864 A | 10/1973 | Okumura et al. |
| 4,260,910 A | 4/1981 | Colman |
| 4,476,480 A * | 10/1984 | Fuse ................. H01L 21/74 257/593 |
| 4,520,277 A | 5/1985 | Hahn |
| 4,528,461 A | 7/1985 | Shackle et al. |
| 4,633,283 A | 12/1986 | Avery |
| 4,992,844 A | 2/1991 | Yakushiji |
| 5,043,782 A | 8/1991 | Avery |
| 5,061,652 A | 10/1991 | Bendernagel et al. |
| 5,081,517 A | 1/1992 | Contiero et al. |
| 5,091,763 A | 2/1992 | Sanchez |
| 5,212,106 A | 5/1993 | Erb et al. |
| 5,212,618 A | 5/1993 | O'neill et al. |
| 5,235,201 A | 8/1993 | Honna |
| 5,276,582 A | 1/1994 | Merrill et al. |
| 5,341,005 A | 8/1994 | Canclini |
| 5,343,053 A | 8/1994 | Avery |
| 5,371,401 A | 12/1994 | Kurita |
| 5,432,366 A | 7/1995 | Banerjee et al. |
| 5,436,486 A | 7/1995 | Fujishima et al. |
| 5,440,151 A | 8/1995 | Crevel et al. |
| 5,440,162 A | 8/1995 | Worley et al. |
| 5,473,169 A | 12/1995 | Ker et al. |
| 5,485,023 A | 1/1996 | Sumida |
| 5,541,801 A | 7/1996 | Lee et al. |
| 5,576,557 A | 11/1996 | Ker et al. |
| 5,576,574 A | 11/1996 | Hong |
| 5,594,266 A | 1/1997 | Beigel et al. |
| 5,602,409 A | 2/1997 | Olney |
| 5,610,425 A | 3/1997 | Quigley et al. |
| 5,615,074 A | 3/1997 | Avery |
| 5,637,892 A | 6/1997 | Leach |
| 5,637,901 A | 6/1997 | Beigel et al. |
| 5,652,689 A | 7/1997 | Yuan |
| 5,663,860 A | 9/1997 | Swonger |
| 5,668,024 A | 9/1997 | Tsai et al. |
| 5,719,432 A | 2/1998 | Kariyazono et al. |
| 5,736,769 A | 4/1998 | Nishiura et al. |
| 5,742,084 A | 4/1998 | Yu |
| 5,745,323 A | 4/1998 | English et al. |
| 5,757,045 A | 5/1998 | Tsai et al. |
| 5,781,389 A | 7/1998 | Fukuzako et al. |
| 5,786,617 A | 7/1998 | Merrill et al. |
| 5,818,088 A | 10/1998 | Ellis |
| 5,832,376 A | 11/1998 | Henderson et al. |
| 5,862,301 A | 1/1999 | Gontowski |
| 5,889,644 A | 3/1999 | Schoenfeld et al. |
| 5,892,264 A | 4/1999 | Davis et al. |
| 5,895,940 A | 4/1999 | Kim |
| 5,912,490 A | 6/1999 | Hebert et al. |
| 5,949,094 A | 9/1999 | Amerasekera |
| 5,973,341 A | 12/1999 | Letavic et al. |
| 5,998,813 A | 12/1999 | Bernier |
| 6,084,269 A | 7/2000 | Davies et al. |
| 6,097,068 A | 8/2000 | Brown et al. |
| 6,137,140 A | 10/2000 | Efland et al. |
| 6,144,542 A | 11/2000 | Ker et al. |
| 6,159,814 A | 12/2000 | Gardner et al. |
| 6,236,087 B1 | 5/2001 | Daly et al. |
| 6,248,652 B1 | 6/2001 | Kokubun |
| 6,258,634 B1 | 7/2001 | Wang et al. |
| 6,310,379 B1 | 10/2001 | Andresen et al. |
| 6,329,694 B1 | 12/2001 | Lee et al. |
| 6,365,475 B1 | 4/2002 | Cheng et al. |
| 6,403,992 B1 | 6/2002 | Wei |
| 6,404,261 B1 | 6/2002 | Grover et al. |
| 6,423,987 B1 | 7/2002 | Constapel et al. |
| 6,462,360 B1 * | 10/2002 | Higgins, Jr. ........ H01L 21/8221 257/189 |
| 6,501,632 B1 | 12/2002 | Avery et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,690,557 B2 | 2/2004 | Hung et al. |
| 6,704,180 B2 | 3/2004 | Tyler et al. |
| 6,707,118 B2 | 3/2004 | Muljono et al. |
| 6,713,816 B1 | 3/2004 | Wolf et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,882,009 B2 | 4/2005 | Ker et al. |
| 6,927,957 B1 | 8/2005 | Bakulin et al. |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,471,493 B1 | 12/2008 | Huang et al. |
| 7,479,672 B2 | 1/2009 | Zhao |
| 7,538,998 B2 | 5/2009 | Tsai et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,859,082 B2 | 12/2010 | Stecher |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,278,684 B1 | 10/2012 | Walker et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,462,477 B2 | 6/2013 | Modica et al. |
| 8,466,489 B2 | 6/2013 | Salcedo et al. |
| 8,476,684 B2 | 7/2013 | Coyne et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,946,822 B2 | 2/2015 | Salcedo et al. |
| 8,947,841 B2 | 2/2015 | Salcedo et al. |

(56) References Cited

U.S. PATENT DOCUMENTS

| | | |
|---|---|---|
| 9,520,486 B2 | 12/2016 | Coyne et al. |
| 2001/0031521 A1 | 10/2001 | Pan et al. |
| 2001/0040254 A1 | 11/2001 | Takiguchi |
| 2001/0050374 A1 | 12/2001 | Yoshitake |
| 2002/0021538 A1 | 2/2002 | Chen |
| 2002/0033520 A1 | 3/2002 | Kunikiyo |
| 2002/0074604 A1 | 6/2002 | Wang et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0125931 A1 | 9/2002 | Yue et al. |
| 2002/0140050 A1 | 10/2002 | Bohlin et al. |
| 2002/0153564 A1 | 10/2002 | Shirai |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2003/0116785 A1 | 6/2003 | D'Anna et al. |
| 2003/0147190 A1 | 8/2003 | Ker et al. |
| 2003/0151877 A1 | 8/2003 | Young et al. |
| 2003/0168701 A1 | 9/2003 | Voldman |
| 2003/0197543 A1 | 10/2003 | Imai |
| 2003/0209758 A1 | 11/2003 | Lee et al. |
| 2004/0027745 A1 | 2/2004 | Kunz et al. |
| 2004/0048428 A1 | 3/2004 | Tanomura |
| 2004/0135229 A1 | 7/2004 | Sasahara |
| 2004/0164354 A1 | 8/2004 | Mergens et al. |
| 2004/0190208 A1 | 9/2004 | Levit |
| 2004/0195644 A1 | 10/2004 | Mallikarjunaswamy |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0047037 A1 | 3/2005 | Litwin et al. |
| 2005/0057866 A1 | 3/2005 | Mergens et al. |
| 2005/0077571 A1 | 4/2005 | Kanda et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0111150 A1 | 5/2005 | Jang et al. |
| 2005/0133869 A1 | 6/2005 | Ker et al. |
| 2005/0151160 A1 | 7/2005 | Salcedo et al. |
| 2005/0195540 A1 | 9/2005 | Streibl et al. |
| 2005/0280091 A1 | 12/2005 | Huang et al. |
| 2006/0033163 A1 | 2/2006 | Chen |
| 2006/0091497 A1 | 5/2006 | Sato |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2006/0250732 A1 | 11/2006 | Peachey |
| 2007/0007545 A1 | 1/2007 | Salcedo et al. |
| 2007/0058307 A1 | 3/2007 | Mergens et al. |
| 2007/0087500 A1 | 4/2007 | Son et al. |
| 2007/0138558 A1 | 6/2007 | Saitoh |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2008/0218920 A1 | 9/2008 | Vanysacker et al. |
| 2008/0237707 A1 | 10/2008 | Suzuki et al. |
| 2009/0032837 A1 | 2/2009 | Tseng et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0080128 A1 | 3/2009 | Tsuchihashi |
| 2009/0122452 A1 | 5/2009 | Okushima |
| 2009/0206376 A1 | 8/2009 | Mita et al. |
| 2009/0230426 A1 | 9/2009 | Carpenter et al. |
| 2009/0231766 A1 | 9/2009 | Chang et al. |
| 2009/0236631 A1 | 9/2009 | Chen et al. |
| 2009/0309128 A1 | 12/2009 | Salcedo et al. |
| 2010/0027174 A1 | 2/2010 | Galy et al. |
| 2010/0059028 A1 | 3/2010 | Ueno |
| 2010/0109631 A1 | 5/2010 | Vinson |
| 2010/0121404 A1 | 5/2010 | Bjorling et al. |
| 2010/0133583 A1 | 6/2010 | Mawatari et al. |
| 2010/0148265 A1 | 6/2010 | Lin et al. |
| 2010/0155858 A1 | 6/2010 | Chen |
| 2010/0163973 A1 | 7/2010 | Nakamura et al. |
| 2010/0163986 A1 | 7/2010 | Kim |
| 2010/0171149 A1* | 7/2010 | Denison ............ H01L 29/7436 257/173 |
| 2010/0232081 A1 | 9/2010 | Disney |
| 2010/0301389 A1 | 12/2010 | Kushner et al. |
| 2010/0321092 A1 | 12/2010 | Momota et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0133246 A1 | 6/2011 | Ueno |
| 2011/0176244 A1 | 7/2011 | Gendron et al. |
| 2011/0181991 A1 | 7/2011 | Tailliet |
| 2011/0207409 A1 | 8/2011 | Ker et al. |
| 2011/0284922 A1 | 11/2011 | Salcedo et al. |
| 2011/0291738 A1 | 12/2011 | Biela et al. |
| 2011/0303947 A1 | 12/2011 | Salcedo et al. |
| 2011/0304944 A1 | 12/2011 | Salcedo et al. |
| 2012/0007138 A1 | 1/2012 | Nguyen |
| 2012/0091503 A1 | 4/2012 | Su |
| 2012/0133025 A1 | 5/2012 | Clarke et al. |
| 2012/0175673 A1 | 7/2012 | Lee |
| 2012/0182659 A1 | 7/2012 | Wang et al. |
| 2012/0194953 A1 | 8/2012 | Mikolajczak |
| 2012/0199874 A1 | 8/2012 | Salcedo et al. |
| 2012/0205714 A1 | 8/2012 | Salcedo et al. |
| 2012/0286325 A1 | 11/2012 | Coyne |
| 2012/0286327 A1 | 11/2012 | Coyne |
| 2012/0286396 A1 | 11/2012 | Coyne |
| 2012/0293904 A1 | 11/2012 | Salcedo et al. |
| 2013/0099280 A1 | 4/2013 | Coyne |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |
| 2017/0117266 A1 | 4/2017 | Coyne et al. |

FOREIGN PATENT DOCUMENTS

| | | |
|---|---|---|
| EP | 0 234 269 A2 | 9/1987 |
| EP | 0508975 A1 | 10/1992 |
| EP | 0 730 293 | 9/1996 |
| EP | 1 703 560 A2 | 9/2006 |
| EP | 2 246 885 A1 | 11/2010 |
| JP | 2004-533713 | 11/2004 |
| JP | 2007-49137 | 2/2007 |
| JP | 2008-147527 | 6/2008 |
| JP | 2008-182239 | 8/2008 |
| KR | 10-2006-0067100 | 2/2006 |
| KR | 10-2009-0123683 | 12/2009 |
| KR | 10-2010-0003569 | 1/2010 |
| TW | 200644735 | 12/2006 |
| TW | 200733305 | 9/2007 |
| WO | WO 90/15442 A1 | 12/1990 |
| WO | WO 1995/022842 A1 | 8/1995 |
| WO | WO 97/10615 | 3/1997 |
| WO | WO 2008/135812 A1 | 11/2008 |
| WO | WO 2010/011394 A1 | 1/2010 |
| WO | WO 2012/154875 A1 | 11/2012 |

OTHER PUBLICATIONS

Chang et al., High-k Metal Gate-bounded Silicon Controlled Rectifier for ESD Protection, 34th Electrical Overstress/Electrostatic Discharge Symposium, Sep. 2012, 7 pages.

Chinese Office Action dated Apr. 29, 2014 for Chinese Application No. 201080049940.X filed on Oct. 4, 2010. 16 pages.

(56) References Cited

OTHER PUBLICATIONS

Chinese Office Action dated Oct. 30, 2014 for Chinese Application No. 201080049940.X, filed on Oct. 4, 2010. 6 pages.
De Heyn et al "Design and Analysis of New Protection Structures for Smart Power Technology with Controlled Trigger and Holding Voltage" 2001 IEEE International Reliability Physics Symposium, IEEE Apr. 2001, pp. 253-258.
EPO Communication and Response pursuant to Rules 161 (1) and 162 EPC dated Jun. 13, 2012 for European Application No. 10733187.8. 2 pages.
European office action dated May 13, 2015, in EP application No. 10766187.8. 6 pages.
Gendron et al., "Deep Trench NPN Transistor for Low-RON ESD Protection of High-Voltage I/Os in Advance Smart Power Technology," BIPOLAR/BICMOS Circuits and Technology Meeting, IEEE, Oct. 1, 2006, pp. 1-4.
International Preliminary Report on Patentability dated Mar. 1, 2012 for International Application No. PCT/US2010/051356. 18 pages.
Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.
Partial International Search Report dated Dec. 8, 2010 for International application PCT/US2010/051356. 10 pages.
Salcedo et al., Bidirectional Devices for Automotive-Grade Electrostatic Discharge Applications, IEEE Electron Device Letters, vol. 33, No. 6, Jun. 2012, 3 pages.
Salcedo et al., Electrostatic Discharge Protection Framework for Mixed-Signal High Voltage CMOS Applications, IEEE Xplore, downloaded Feb. 23, 2010 at 12:53 EST, 4 pages.
Salcedo et al., On-Chip Protection for Automotive Integrated Circuits Robustness, 2012 8th International Caribbean Conference on Devices, Circuits and Systems (ICCDCS), 5 pages, Mar. 2012.
Taiwanese office action with Translation dated Mar. 10, 2015, in TW application No. 099136457. 21 pages.
Urresti et al., "Lateral Punch-Through TVS Devices for on-Chip Protection in Low-Voltage Applications," Microelectronics Reliability, 2005, pp. 1181-1186, vol. 45.
Walker et al., "Novel Robust High Voltage ESD Clamps for LDMOS Protection," 45th Annual International Reliability Physics Symposium, 2007, IEEE International, Apr. 1, 2007, pp. 596-597.
Written Opinion of the International Preliminary Examining Authority for application PCT/US2010/051356, dated Jan. 25, 2012, 32 pages.
Jul. 20, 2012 Int'l Search Report for Int'l. App. No. PCT/US2012/037028.
Jul. 23, 2012 Invitation to Pay Additional Fees for Int'l. App. No. PCT/US2012/037160.
Jul. 25, 2012 Int'l Search Report for Int'l App. No. PCT/US2012/037154.
Oct. 10, 2012 Int'l Search Report for Int'l Application No. PCT/US2012/037160.
Mar. 12, 2013 Office Action from U.S. Appl. No. 13/279,122.
Apr. 10, 2013 Office Action from U.S. Appl. No. 13/105,667.
Nov. 12, 2013 International Preliminary Report on Patentability from Int'l Application No. PCT/US2012/037154.
Nov. 21, 2013 International Preliminary Report on Patentability from Int'l Application No. PCT/US2012/037028.
Nov. 21, 2013 International Preliminary Report on Patentability from Int'l Application No. PCT/US2012/037160.
Jan. 14, 2014 Notice of Allowance from U.S. Appl. No. 13/105,667.
Nov. 18, 2014 Office Action from JP Application No. 2014-510420.
Jul. 23, 2015 Office Action from JP Application No. 2014-510420.
Mar. 3, 2016 Extended European Search Report from EP Application No. 15183728.3.
Jul. 6, 2016 Int'l Search Report for Int'l Application No. PCT/US2016/022364.
Oct. 8, 2016 Office Action from CN Application No. 201280022685.9.
Sep. 27, 2017 Office Action in EP Application No. 12722248.7.
Amerasekera, et al. "ESD in Silicon Integrated Circuits," John Wiley & Sons (1995) pp. 44-49.
Baliga, "Silicon RF Power Mosfets", World Scientific, 2005, Chapter 4 Lateral-Diffused MOSFETs, 33 pages.
AD524, Analog Devices, "Precision Instrumentation Amplifier," dated Nov. 2007 (28 pgs).
Salcedo, J., "Design and Characterization of Novel Devices for New Generation of Electrostatic Discharge (ESD) Protection Structures," Ph.D. Dessertation, Summer Term 2006 (198 pgs).
Jul. 6, 2016, International Search Report & Written Opinion for Int'l Application No. PCT/US2016/022364 (13 pgs).
Mar. 3, 2016 Extended European Search Report for EP Application No. 15183728.3 (7 pgs).
Mar. 29, 2011 Invitation to Pay Additional Fees for Int'l Application No. PCT/US2010/051356 (6 pgs).

\* cited by examiner

ELECTROSTATIC PROTECTION DEVICE

CROSS-REFERENCE TO RELATED APPLICATIONS

This application is a continuation of U.S. application Ser. No. 12/612,609, filed Nov. 4, 2009, titled "ELECTROSTATIC PROTECTION DEVICE," the entire disclosure of which is hereby incorporated herein by reference.

FIELD OF THE DISCLOSURE

The present application relates to an improved electrostatic discharge protection device.

BACKGROUND

It is well known that some integrated circuit technologies are susceptible to damage by electrostatic discharge (ESD). CMOS transistors which are frequently used in logic circuits are an example of such devices. Protection schemes are known, such as providing diodes connecting an input pin to the device supply rails. However these measures are crude and can switch into a conducting state during normal operating conditions.

More sophisticated ESD protection circuits have been implemented using transistors within an integrated circuit. However, the transistor parameters and fabrication processes used in these integrated ESD protection circuits have not typically been optimized for their ESD function. Instead, the performance characteristics of these ESD transistors have largely been dependent upon fabrication parameters chosen to optimize other transistors that carry out the primary function of the circuit to be protected. Therefore, it has mainly been a matter of luck whether the fabrication parameters chosen to optimize majority devices are suitable for use in the accompanying ESD protection circuit. While it is possible to separately optimize an ESD protection circuit using additional processing steps, those additional processing steps carry increased costs. Instead, a reliable method of tailoring ESD protection device performance without using additional processing steps is required.

SUMMARY OF THE DISCLOSURE

According to a first aspect of the present invention there is provided an apparatus including an electrostatic discharge protection device comprising a semiconductor having first, second and third regions arranged to form a transistor, wherein the first region is doped with a first impurity of a first dopant type and is separated from the second region which is doped with a second impurity of a second dopant type, and wherein the electrostatic discharge protection device is adapted such that at least one of the following applies:

the separation between the first and second regions defines a trigger voltage to cause the electrostatic discharge protection device to become conducting; and a first spatial parameter of the second region controls a holding voltage of the electrostatic discharge protection device.

It is thus possible to provide an electrostatic protection device where the trigger is determined by the distance between the first and second regions, both of which are regions at the surface of the semiconductor, either in the finished device or during one of the processing steps in its fabrication, and hence their separation is well controlled during the masking and doping processes, as known to the person skilled in the art. It is feasible that other structures might be formed over the surface of the electrostatic protection device. In these circumstances the relevant separation would still have been defined at a surface of the semiconductor whilst the surface was exposed during fabrication. In any event the device properties may still be controlled by structures or dimensions defined on a surface in a horizontal plane, whether or not that surface is buried.

In some embodiments, a holding voltage can be controlled by controlling a width, area, or volume of the second region. It is thus possible to control the holding voltage by varying a spatial parameter that is easily modified during the masking and doping steps.

Thus, both the breakdown voltage and the holding voltage may be defined by dimensions at the surface of the device (or at least in a horizontal plane), and which are controllable during device fabrication.

According to a second aspect of the present invention there is provided a method of manufacturing an electronic apparatus including an electrostatic protection device. The method includes forming a horizontal bipolar transistor in a semiconductor substrate. The method also includes either: (1) selecting a first distance between a collector region and a base region to define a trigger voltage for the device; or (2) selecting a width of a base region to define a holding voltage.

According to a third aspect of the present invention there is provided an integrated circuit including an electrostatic discharge protection device according to the first aspect of the present invention.

BRIEF DESCRIPTION OF THE DRAWINGS

The present invention will now be described, by way of non-limiting example only, with reference to the accompanying drawings, in which.

DETAILED DESCRIPTION OF PREFERRED EMBODIMENTS

Terms such as above, below, over, and so on as used herein refer to a semiconductor device orientated as shown in the figures and should be construed accordingly. It should also be appreciated that, because regions within a semiconductor device are defined by doping different parts of a semiconductor with differing impurities or differing concentrations of impurities, discrete physical boundaries between different regions may not actually exist in the completed device but instead regions may transition form one to another. Some boundaries as shown in the accompanying figures are of this type and are illustrated as abrupt structures merely for the assistance of the reader. The skilled artisan can readily determine with such gradients where to set boundaries for discrete functional diffusion regions in a semiconductor device.

As noted before, transistors have sometimes been used to provide electrostatic protection devices. However an integrated circuit may contain millions of transistors. The circuit designer wants to use as few process steps as possible in the fabrication of the integrated circuit since each additional masking and implanting step adds further cost. Also each step brings an increased error rate which reduces the yield of working devices formed on a wafer. Thus additional steps are preferably avoided. Given that the majority of transistors on a device will have a specific task, such as forming logic elements, then the transistor parameters are chosen so as to be appropriate for the majority task. Consequently the transistors that are formed are generally not suited for use in electrostatic discharge protection circuits, or give severely compromised performance.

Figure 1:
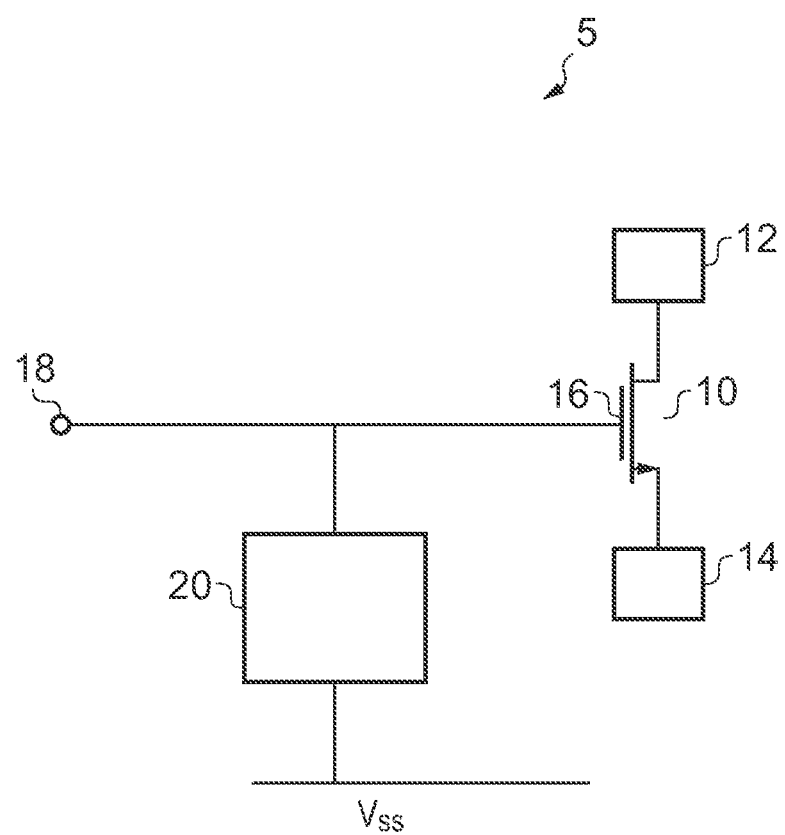
FIG. 1 schematically illustrates an input stage of an integrated circuit, the input stage including an electrostatic discharge protection device.

FIG. 1 shows part of an integrated circuit 5, according to one embodiment. The integrated circuit has a device, in this instance an input transistor 10 whose drain and source are connected to circuit components 12 and 14, which may be any type of circuits with any function for the purpose of the present disclosure. A gate 16 of the transistor is connected to an input terminal 18 of the integrated circuit. The transistor 10 is susceptible to permanent damage due to high voltages of the input terminal 18, for example electrostatic discharge if someone handling the integrated circuit 5 had become charged by walking over a nylon carpet.

In order to protect the transistor 10 from damage, an electrostatic protection device (or circuit) 20 is provided so as to limit the voltage excursions at the gate 16 of the transistor.

It is useful to consider the operation of an electrostatic discharge, ESD, protection device. Ideally, an electrostatic protection device should exhibit a controllable and selectable trigger voltage T. For input voltages having a magnitude less than the trigger voltage T, the device should be in a high-impedance (non-conducting) state. Once the trigger voltage magnitude has been exceeded the device should enter a low impedance state and start conducting.

The protection device may also offer "fold back" or "snap back" such that once it starts conducting, the voltage across the device reduces to a lower value. In this case, the device remains conducting, provided that the input voltage remains above a threshold magnitude, which may be called a "holding voltage".

Figure 2:
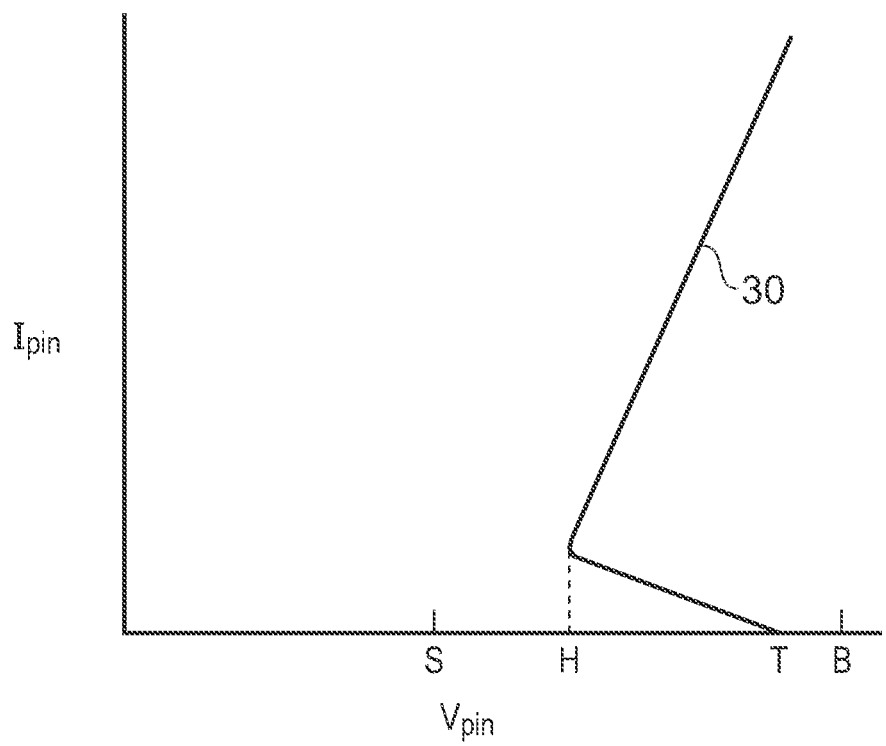
FIG. 2 illustrates a desirable current versus voltage operating characteristic of an electrostatic discharge protection device.

FIG. 2 illustrates an operating characteristic of an electrostatic protection device. It can be seen that the ESD protection device does not pass any current until a trigger voltage T has been reached. The trigger voltage is less than a breakdown voltage B for the device being protected. Once the trigger voltage has been reached the ESD protection device starts conducting, and the voltage across the device falls back to a holding voltage H. Although in an ideal device current flow could then increase without the voltage across the device increasing, due to resistance within the device, the voltage increases slightly with increasing current in the region 30. If the holding voltage is not outside the supply rail voltage range, then once the ESD protection device has switched on, it will not switch off. Once the voltage across the device has decreased below a holding voltage, H, the ESD protection device can return to a high impedance state, effectively switching off.

The inventors realized that for a given transistor fabrication process, it would be desirable for the trigger voltage and the holding voltage to be well controlled, and better still, adjustable. Doping concentrations and thermal budgets are already constrained by the function of the majority devices when those devices are simultaneously fabricated with ESD protection device(s). Therefore, those control parameters are not accessible to independently tailor ESD protection device performance. Fabrication steps to tailor doping just for ESD protection devices are costly, and it is not feasible to separate thermal budgets for different devices on the same substrate. Thus, it may be useful to control other device parameters and internal transistor processes.

Figure 3:
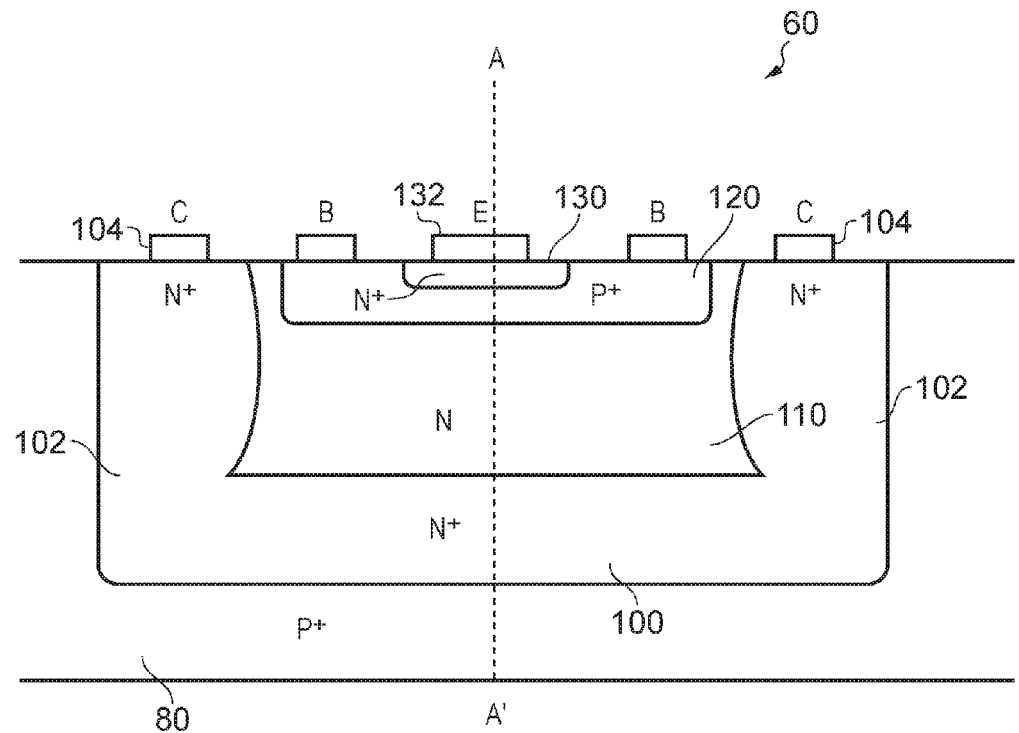
FIG. 3 illustrates a device structure for a vertically fabricated NPN prior art transistor.

Consider, for example, the structure of a vertically formed NPN bipolar transistor. During device fabrication the semiconductor wafer exists as a slab whose width and length is much greater than its depth. A surface of the wafer is exposed to impurities for doping. The surface is regarded as an upper horizontal surface in a frame of reference that is adopted for the purposes of description. An exemplary prior-art transistor 60 is illustrated in FIG. 3. The device shown in FIG. 3 represents a single transistor within an integrated circuit, which may have millions of transistors formed thereon. The active part of the transistor comprises an $N^+$ region 100 which acts as the collector of the transistor. The N type region is formed by doping the semiconductor with a donor impurity, as is well known to the person skilled in the art. The "+" symbol represents a region of relatively heavy doping. This, again, is a convention well known to and understood by the person skilled in the art. The N type region can be formed as a well within a P type substrate 80. This gives rise to the formation of a PN junction well, which can be reverse biased so as to isolate the bulk of the transistor from other transistors within the integrated circuit. Alternatively, the transistor can be formed within a semiconductor well that is defined along its sides and bottom by a layer of silicon dioxide, as is known for silicon on insulator (SOI) fabrication. Connections are made to the collector region 100. This is achieved by providing vertical N type regions 102 extending between the collector region 100 and the surface of the semiconductor. Metallic collector contacts 104 make galvanic contact with the N type semiconductor.

A further region of less heavily doped N type semiconductor 110 is provided above the collector 100, and bounded by the vertical regions 102. It contains a well of $P^+$ doped semiconductor which forms the base region 120 of the transistor. Finally, an emitter region 130 of $N^+$ doped semiconductor is provided along with metallic emitter contact 132. It can be seen that the transistor structure NPN exists vertically along the line A-A'.

However it can also be seen that a horizontal or lateral NPN transistor structure also exists at the surface of the device. This horizontal transistor may be considered to be undesirable as it constitutes a structure that can give rise to breakdown, i.e. unwanted and often uncontrolled current conduction by transistor 60.

Figure 4:
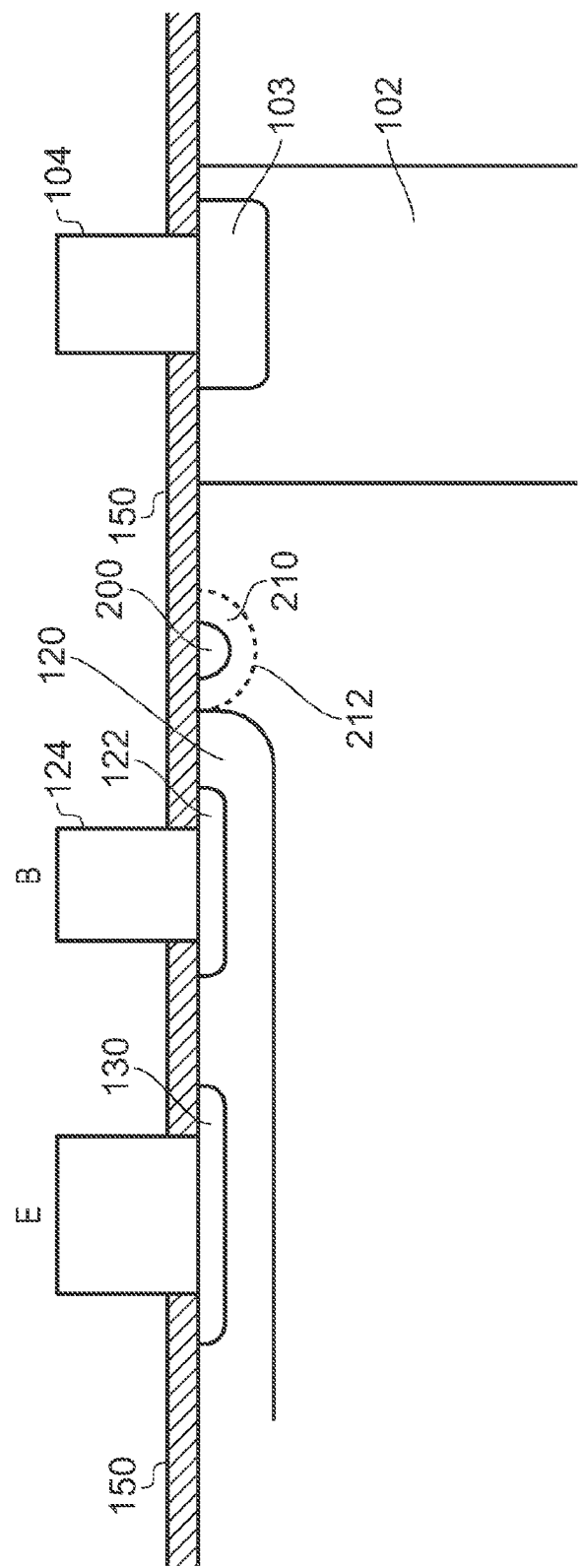
FIG. 4 shows part of the device of FIG. 3 in greater detail, and also shows field gradients that initiate breakdown by impact ionization.

FIG. 4 looks at a portion of the transistor shown in FIG. 3 in greater detail and specifically focuses on the region near the surface of the device that includes the emitter, base and collector regions 130, 120, 100 (see FIG. 3). As well as showing nominal device structure, it also shows simulated electric field gradients. As the device is being shown in greater detail, some additional features are also shown. Thus a region 122 of enhanced $P^+$ doping (sometimes designated $P^{++}$) is provided under a metallic base contact 124 to improve conductivity in this region. Similarly a region 103 of enhanced $N^+$ type doping is provided under the metallic collector contact 104 to improve conductivity.

In the finished device an oxide layer 150 is provided over the surface of the transistor.

Although the device structures, such as the base and the collector have been shown as being well defined, it should be appreciated that during fabrication, the doping (e.g., ion implantation) process occurs from above the surface of the device (when viewed in the frame of reference adopted herein) so dopant concentrations are greater near the surface and naturally decrease with increasing depth into the wafer. Following implantation, a diffusion step is performed where the wafer is heated. This allows dopants to spread helping smear out local discontinuities in dopant concentration. However diffusion occurs in all directions so the theoretically sharp delineation between the base region 120 and the layer 110 becomes a smoother change in concentration and hence the transistor does not have a sharp boundary between these regions.

It should also be noted that higher dopant concentrations near a junction between dissimilarly doped materials means that the depletion region is smaller and hence any voltage difference between the dissimilar regions is dropped across a smaller distance, and hence the electrostatic field gradient is higher.

Given that implantation occurs from above, it follows that the highest field gradient tends to be near the surface of the transistor, even after the thermal diffusion step has occurred. Thus the depletion region of a junction is narrower near the upper surface of the transistor.

Additionally, it is known from electrostatic theory that the field gradient increases around a curved surface. The formation of the base layer gives rise to a structure having a nominally flat lower surface (which can be regarded as part of a cylinder of infinite radius) with curved edges (which can be regarded as a cylinder having a radius similar to the diffusion distance). Thus, the curvature at the edge of the base region gives rise to a field strength enhancement.

The simulation of electric field gradients shown in FIG. 4 shows a small portion of the device representing the first portion to suffer breakdown occurring at a region 200 adjacent the edge of the base region 120. This region 200 marks the interface between the base and the collector, known as the base-collector junction, where the field gradient exceeds $5 \times 10^5$ volts per meter. The region 210 enclosed by broken line 212 has a field gradient greater than $4 \times 10^5$ volts per meter.

The high field gradient provokes impact ionization in region 200, with carriers (in this case electrons), being swept towards and injected into the base region. Here they may cause the device to turn on, and if the current flow in the device is not limited by an external factor the collector current will increase until the device becomes damaged.

However, the inventors realized that the impact ionization driven breakdown process in this vertical transistor is highly controllable for a given fabrication process. In fact, experimentation has shown that the trigger voltage can be directly set by controlling the separation between the edge of the base and the edge of the collector region. This distance can be defined by masks during the doping stages of device fabrication.

In embodiments described herein, impact ionization sets up a current in the base, which forward biases the base-emitter junction and turns the transistor on. This in turn causes an emitter current which itself gives rise to the creation of additional impact ionization, by virtue of a combination of current density and electric field gradient occurring within a region of the device.

Once the device has turned on, in order to perform its function, it should stay on while the voltage across the device exceeds a holding voltage and/or the current therein exceeds a holding value. The holding voltage is the voltage across the device that is required to sustain the impact ionization process. Normally, device designers go to considerable lengths to try and avoid impact ionization from occurring. However, in embodiments of the invention, not only is the device modified so as to allow the onset of impact ionization to be controlled so as to set the trigger voltage, but the device is also designed so as to sustain impact ionization provided the voltage across the device exceeds a holding voltage. Of course, the designer may also want to control the holding voltage.

Once impact ionization has started, the current flow in the semiconductor enhances the impact ionization effect. In broad terms, impact ionization can be achieved with large voltages and small current densities or, critically, larger current densities and reduced voltages.

The inventors realized that controlling the size of the base region controls the current gain of a transistor, and that this in turn would provide a mechanism for controlling the holding voltage of the protection device. It is of course desirable for the control mechanism to be reliable and predictable.

This gives rise to a protection device where both the trigger voltage and the holding voltage are definable by features at the surface of the device. Furthermore no additional processing steps are required compared to those required to form the "majority" transistors that aid in carrying out the primary function of the integrated circuit.

Figure 5:
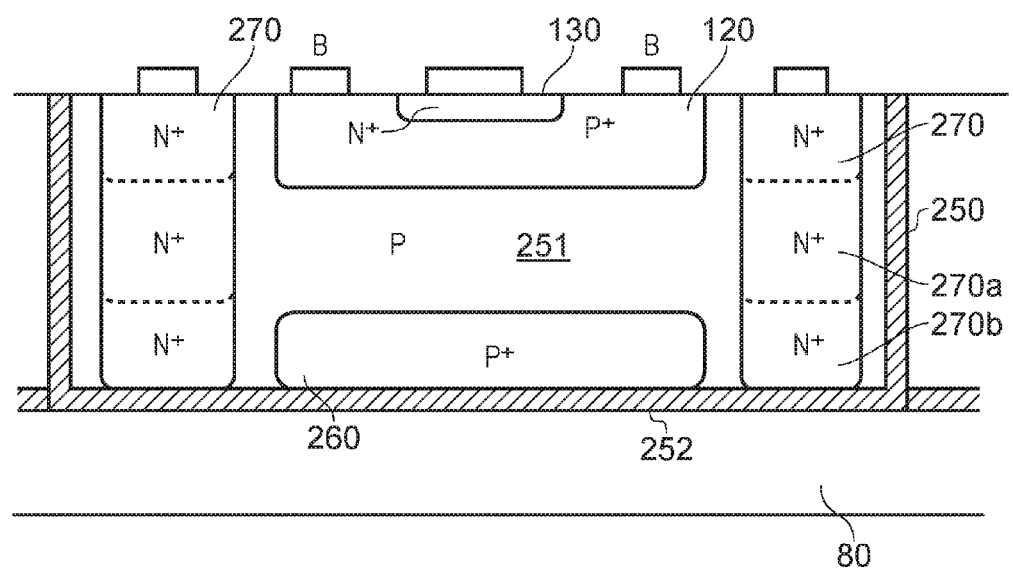
FIG. 5 shows the doping profile of an electrostatic protection device in accordance with an embodiment of the invention.

FIG. 5 schematically illustrates the layout of an ESD protection device in accordance with an embodiment of the invention. The device is illustrated as being fabricated inside a well of semiconductor delimited by insulating material. This may be advantageous as it provides enhanced device isolation (and the processes for providing such isolation are well known and offered by semiconductor fabricators as standard so do not need to be described here).

In another arrangement, the device can instead be fabricated in a region of material that, in combination with the semiconductor substrate, is arranged to form a reverse biased PN junction well for isolation. However, the fabrication inside a well of insulating material (as shown) may be advantageous for an ESD protection device as the magnitude and polarity of the ESD event may be unpredictable. Side walls 250 can be formed as dielectric-filled trenches, whereas the bottom of the well 252 can be provided as silicon dioxide in a SOI structure.

Compared with the standard transistor as shown in FIG. 3, the $N^+$ region 100 along the bottom of the device is omitted, and a $P^+$ region 260 is provided instead. This helps ensure that any vertical NPN transistor structure is prevented. A P region 251 provided between the base region 120 and the P⁺ region 260 also inhibits vertical transistor formation. Additionally, as the transistor is deliberately fabricated as a horizontal structure, the collector regions 270 are only provided in the vicinity of the surface and hence the vertically extending regions 102 (FIG. 3) are omitted. Alternatively, the N⁺ region 270 can be extended by forming region 270a, or regions 270a and 270b, as illustrated. It will be appreciated that as the device may be formed by growing an epitaxial layer over an initial (handle) wafer, then region 270b may be implanted, or otherwise doped, before the layer containing region 270a is grown on the wafer. Similarly, region 270a may be implanted with dopant before a top layer containing region 270 is grown on the wafer or it can be done at the same time. Otherwise, the structure is similar to the device shown in FIG. 3.

Figure 6:
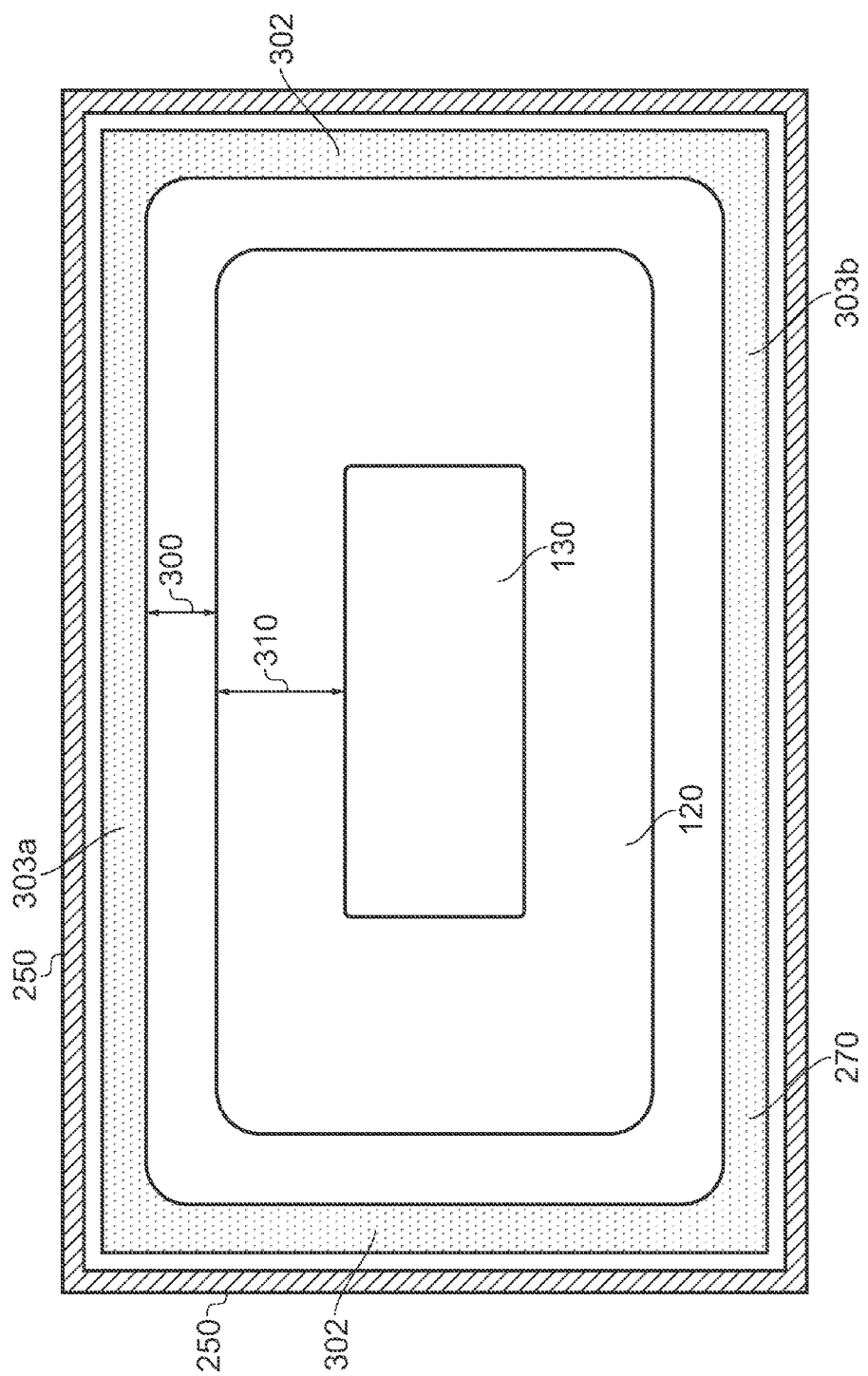
FIG. 6 is a plan view of the device of FIG. 5.

FIG. 6 is a plan view of the surface of the device shown in FIG. 5, and shows where the implantations for the collector region 270, base 120 and emitter 130 are located, according to one embodiment.

The base-collector separation 300 controls the trigger voltage of the ESD protection device. The distance 310, defining the width of the base 120, controls the holding voltage. Thus the device parameters are controlled by spatial features defined at the surface of the device. This means device characteristics can be accurately defined during design of the masks used to define the doping regions.

Similarly, the area and volume of the base 120 may control the holding voltage. For example, the area may be defined at the surface by modifying the width and length of the base 120, depending upon the shape. The volume is defined by the area times depth of the doped region. Thus, generally, a horizontal dimension defined during doping steps can be modulated to affect that horizontal dimension as well as the area and volume of the doped region, such that each of these parameters can be said to control an operational threshold of an ESD device.

Figure 13:
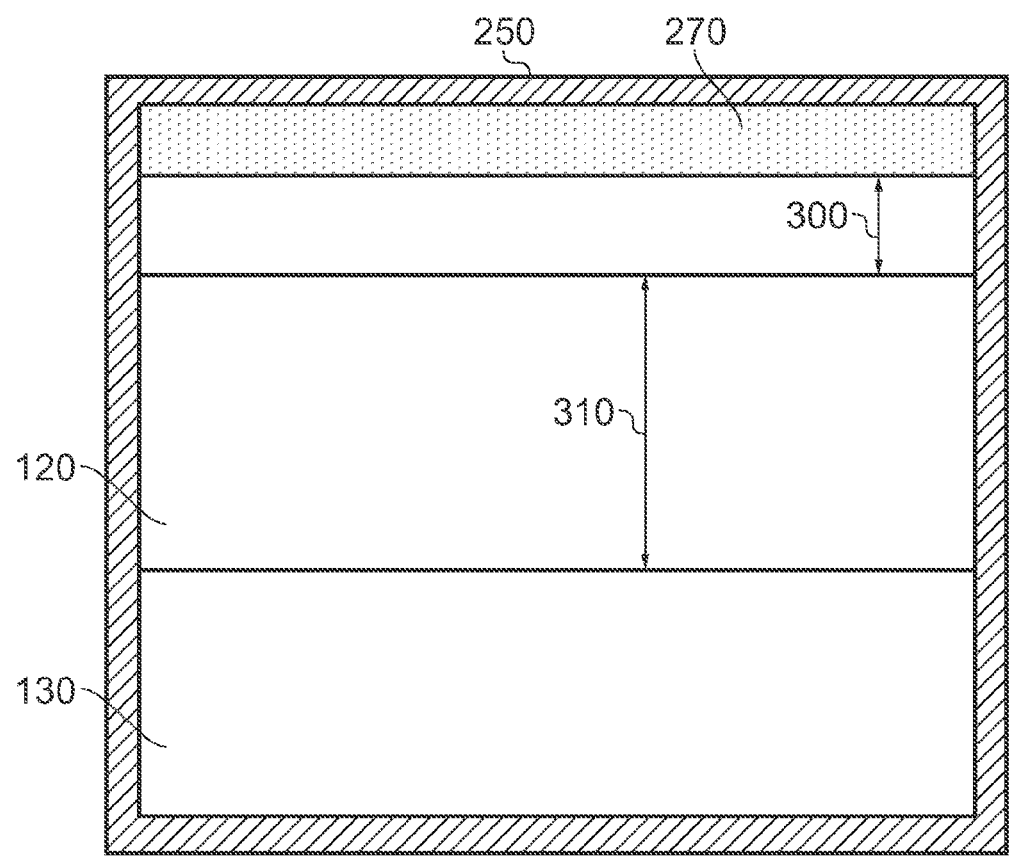
FIG. 13 is a plan view showing a variation on the device shown in FIG. 6.

The device shown in FIG. 6 has 2 planes of reflection symmetry. However, the device need not be formed with such a high degree of symmetry, for example the regions 302 of the collector 270 could be omitted such that the collector was only formed by region 303a at one side, or regions 303a and 303b at two opposing sides if they are electrically connected together. Such a device having the collector 270 at one side thereof and emitter 130 at the other side is shown in FIG. 13.

Figure 7:
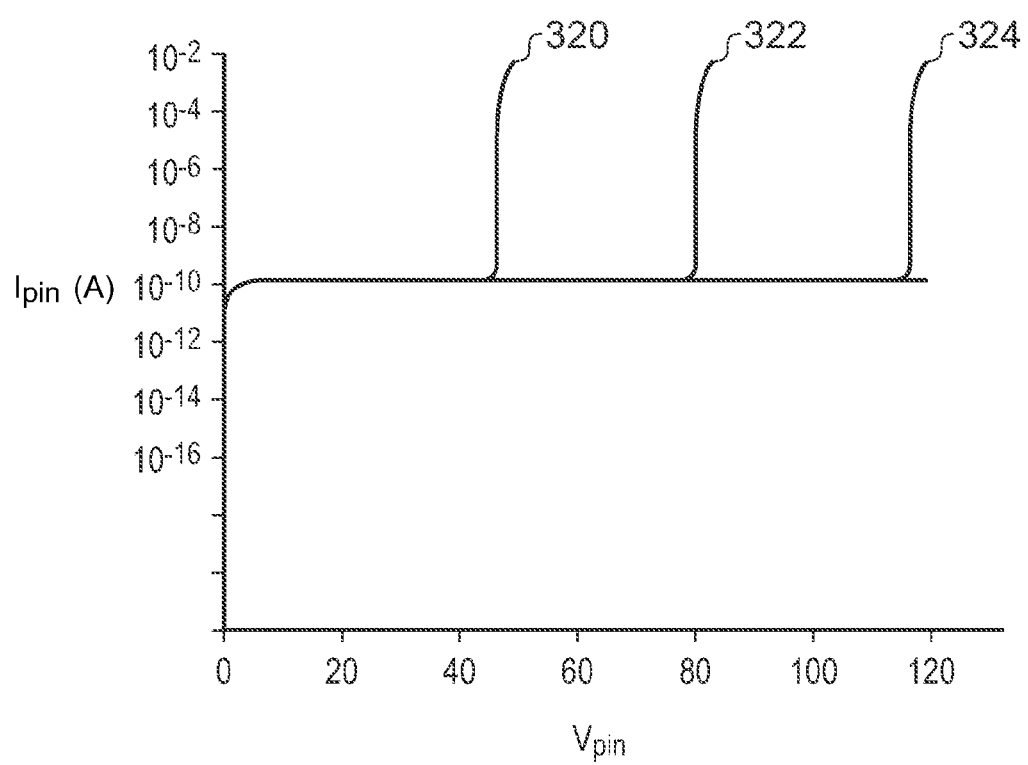
FIG. 7 is a graph of current flow versus pin voltage for a device under test, illustrating different trigger voltages for different collector-base separations in the ESD protection device of FIGS. 5 and 6.

FIG. 7 shows test results for current flow versus voltage for a device under test, according to one embodiment. The input voltage at the terminal 18 (FIG. 1), being protected by an ESD device 20 of the embodiment, was swept from zero, and the current being passed by the ESD device 20 was measured. In this device under test the base width, as designated by line 310 in FIG. 6, was held constant at 45 µm, and the collector-base separation or space 300 between the P-type base and the N-type collector was varied from 12 µm for line 320, to 13 µm for line 322, and 14 µm for line 324. This gave trigger voltages of 45, 78 and 115 volts respectively, for a transistor fabricated in accordance with a given fabrication process. Different processes, having different doping concentrations or thermal budgets give different specific results.

Figure 8:
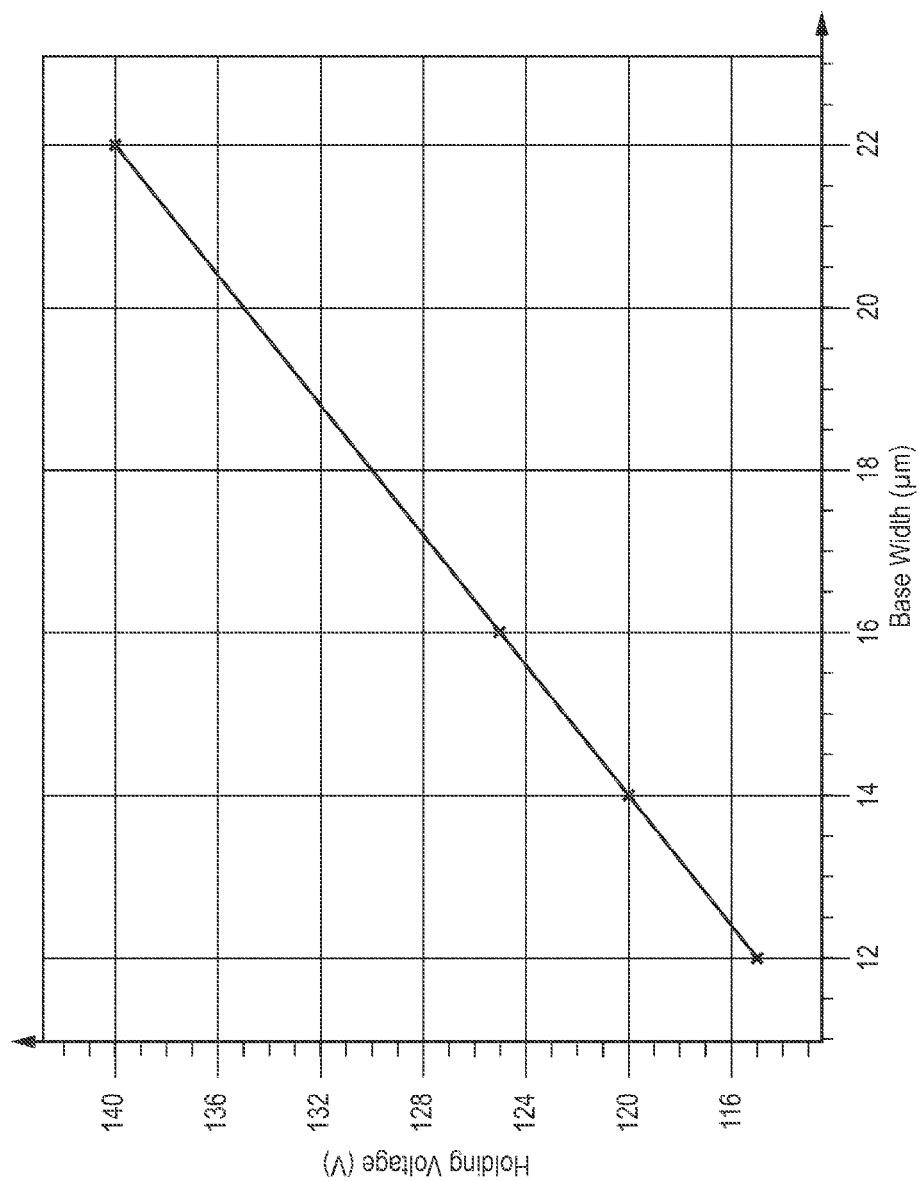
FIG. 8 is a graph showing holding voltage versus base width, according to one embodiment.

A similar test of holding voltage was performed for a base-to-collector spacing of 14 µm and varying the base width from 12 to 50 µm. The holding voltages are shown in FIG. 8. In general terms, the holding voltage increases by approximately 2 V for each 1 µm of base width, in a well behaved manner.

In both examples of modulation in FIGS. 7 and 8, the devices were designed such that changes in a mask-defined, horizontal dimension (e.g., spacing between two doped regions of a transistor or width of a doped region) caused distinct and readily measurable changes in operational thresholds (e.g., trigger voltage or holding voltage) of the ESD protection device 20 incorporating that transistor. Thus, the trigger voltage and holding voltage can be tailored for the ESD protection device 20 and its functions by the simple selection of horizontal dimensions in the doping masks.

Because the ESD protection device 20 allows mask-defined horizontal dimensions to tailor operational thresholds (e.g., trigger voltage or holding voltage), special doping dosages need not be used for this purpose. Instead, a designer may select doping dosages in order to optimize the performance of other transistors to be simultaneously fabricated on the substrate for the same integrated circuit. In some embodiments, at least one ESD protection device 20 is fabricated, and particularly doped, on the substrate simultaneously with at least one "primary" device, by which is meant a non-protective transistor employed in the primary functions of the integrated circuit. During a doping step of the fabrication process, a single mask may be used to simultaneously define at least one doped region or active area of both an ESD device and a primary device. Thus, one or more doped regions of the primary device may share the same dopant dosage and thus about the same maximum dopant levels with one or more doped regions of ESD protection device.

In one embodiment, the primary device is a MOSFET transistor, such as the transistor 10 of FIG. 1 that is to be protected by the ESD protection device. The source and drain regions of such a MOSFET can be simultaneously doped, using the same mask, as one of the regions of the ESD protection device. For example, the source and drain regions of a MOSFET and the base; or the collector and emitter regions of an ESD protection device may be simultaneously doped P⁺, or may be simultaneously doped N⁺, by a single mask. In another embodiment, the emitter region of a primary bipolar transistor and the emitter region of an ESD protection device may be simultaneously doped N⁺, or may be simultaneously doped P⁺, by a single mask. Similarly, each of the ESD protection device base and collector regions can be simultaneously doped with base and collector regions, respectively, of other non-protective bipolar transistors on the substrate.

In each of the foregoing examples, one or more active regions of a primary transistor and the ESD protection transistor share a common dopant dosage and thus about the same maximum dopant level, which may be selected in order to optimize performance of the primary transistor. At the same time, performance of the ESD protection device may be adjusted by selecting a mask-defined horizontal dimension. The ability to tailor an ESD protection device's operational threshold voltages such as trigger voltage and holding voltage through selection of horizontal dimensions in the doping masks allows doping dosages to be optimized for other transistors that are simultaneously fabricated, while still minimizing masking steps by simultaneous doping of both types of transistors.

According to one embodiment, the ESD protection device is connected such that the collector 270 is connected to the terminal 18 of the integrated circuit 5 that is to be protected, and the emitter is connected to the ground supply rail. The base terminal can be left floating or can be connected to the emitter via a resistor. Where a resistor is provided, the voltage difference across the resistor that arises when current flow in the base region has been initiated by impact ionization can be used to further control the "snap back" characteristic of the ESD protection device. This is further discussed below.

The arrangement described hitherto is suitable for providing unidirectional ESD protection. However, ESD events may occur with either polarity, and hence the integrated circuit benefits from protection against input terminal voltages that are either excessively above its positive supply rail, or excessively below its negative supply rail. In order to achieve this bi-directional ESD protection, two devices can be provided in series.

Figure 9:
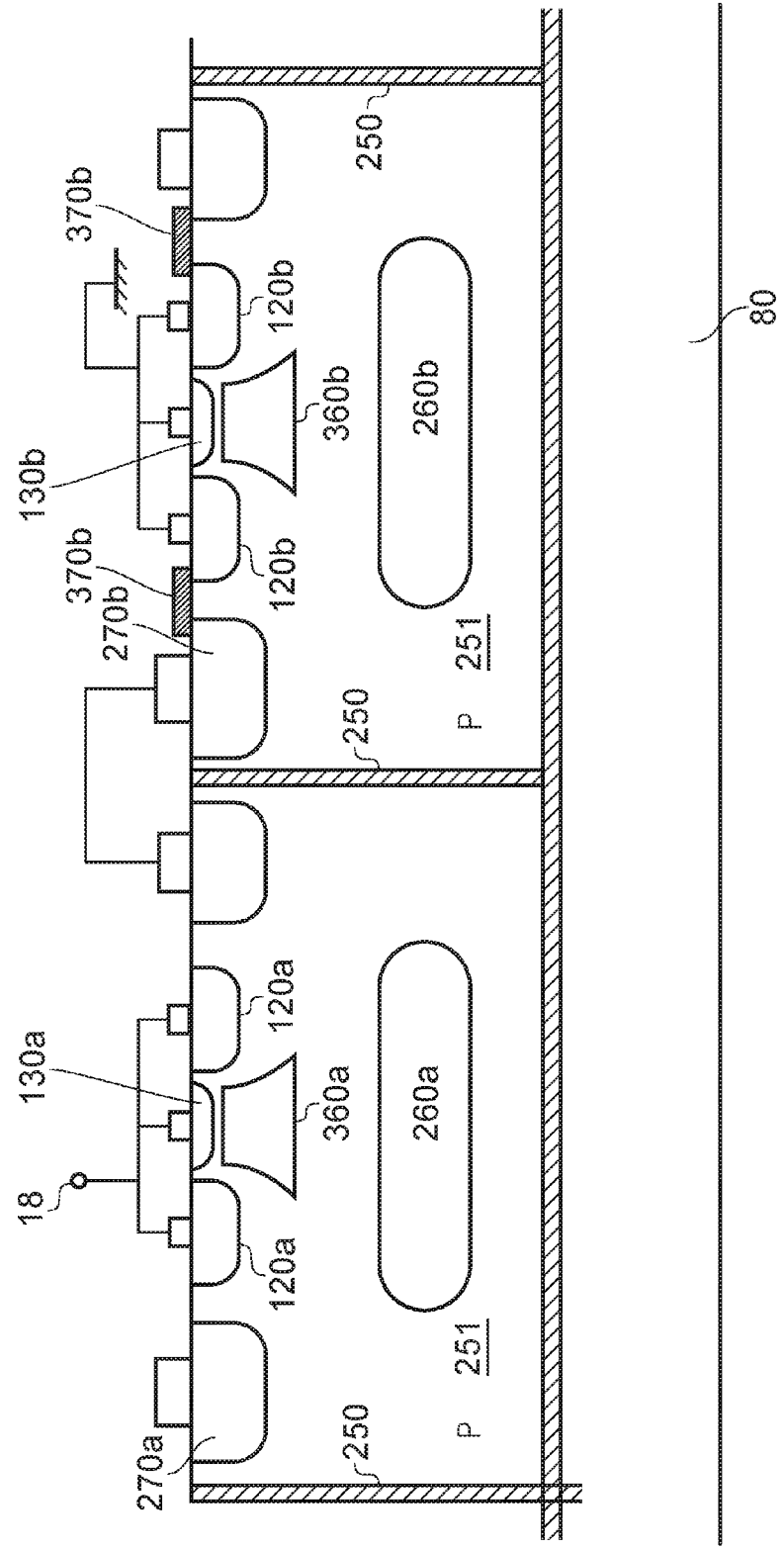
FIG. 9 is a representation of a bidirectional ESD protection device, according to one embodiment.

Two devices similar to that shown in FIG. 5 are illustrated in FIG. 9, according to one embodiment. The same numbering is used as in FIG. 5 to refer to like parts, except that the designations "a" and "b" are used as suffixes. Both are horizontal NPN transistors.

The base regions 120a and 120b are now drawn as a ring surrounding the emitter regions 130a and 130b, which serve to delineate the edges of the regions in a slightly different way than was done in FIG. 5, for purposes of illustrating how the principles and advantages described herein can be obtained using a variety of transistor configurations. The masking and implantation steps remain the same.

However, intrinsic (high impedance) regions 360a and 360b have been fabricated just below the emitter regions 130a and 130b and above the P+ regions 260a and 260b. These regions represent additional measures to stop the formation of parasitic components, such as thyristors, that could cause the device to latch into a conducting state.

In this arrangement the collectors 270a and 270b are connected together, and the emitter 130a and base 120a of one of the ESD protection devices is connected to the terminal 18 that is to be protected. The emitter 130b and base 120b of the other device has a current flow path to a supply rail, and is preferably connected to ground. Thus, for any polarity one of the ESD devices acts as a forward biased diode while the other acts as a reverse biased transistor, and hence breaks down to give the ESD protection when it reaches its trigger voltage. If the polarity of the ESD threat reverses, then the roles of the ESD protection devices reverse, with the one that had previously been acting as a forward biased diode becoming the reverse biased transistor, and the one that had been acting as the reverse biased transistor becoming the forward biased diode. This enables laterally (horizontally) fabricated NPN transistors to provide ESD protection for discharge events of either polarity. The trigger and holding voltages are still defined by the separation between the collector and the base regions, and the size of the base region, respectively within each device. This means the trigger voltages can be set independently for each polarity of ESD threat if desired.

In other embodiments, other modifications may be made to the ESD protection devices. For example a metal plate 370b may be connected to the base or emitter junctions and arranged to extend over the edge of the collector region. This acts as a field plate 370b and helps prevent charge injection occurring in the oxide layer over the base-collector junction. Such a field plate 370b encircles the emitter when viewed in plan view.

Figure 10:
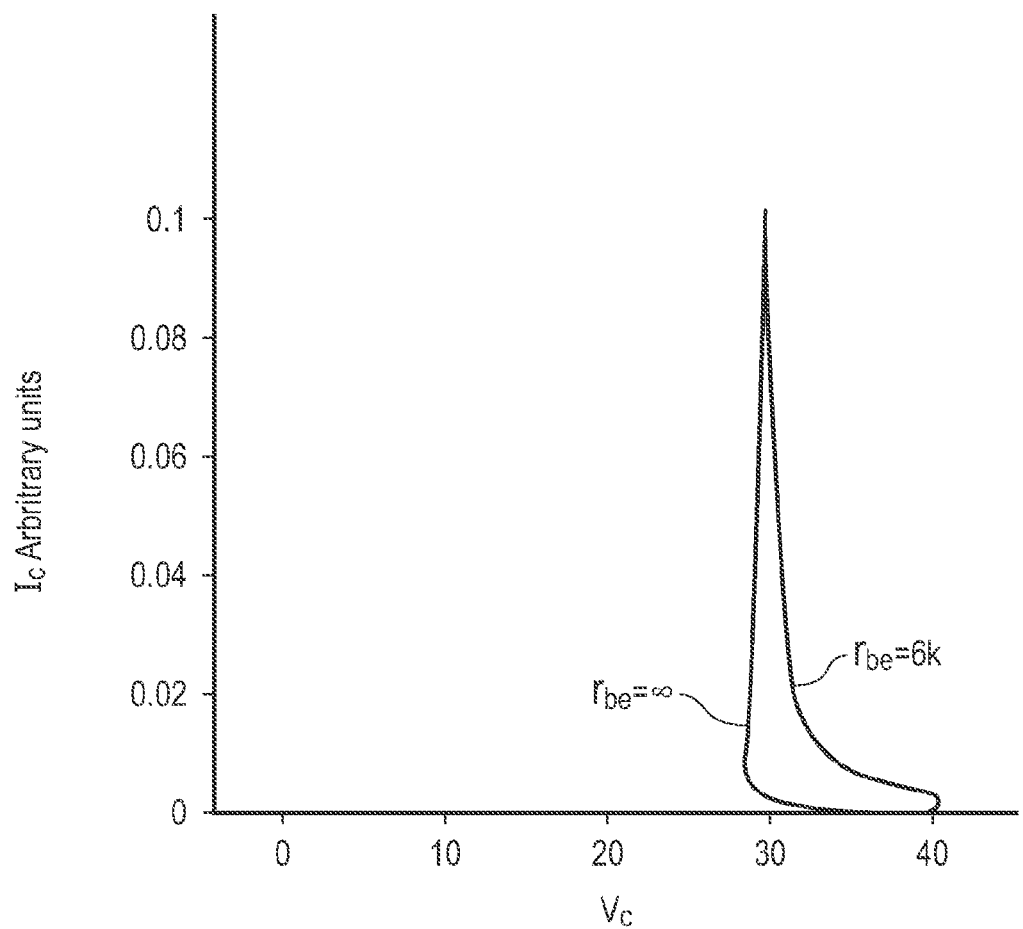
FIG. 10 is a graph of collector current versus collector voltage, illustrating the effect of a base-emitter resistor, according to one embodiment.

As noted earlier, the inclusion of a resistor between the base and emitter terminals can modify the turn on characteristic of the device. FIG. 10 illustrates the collector current versus collector voltage characteristics for a device in a grounded emitter configuration, according to two embodiments. Both devices have the same trigger voltage of 40 V, but once the device has triggered, the device with a floating base snaps back more deeply than a similar device with a 6 KΩ resistor connecting the base and emitter terminals. Thus the resistor helps determine the collector current to turn the horizontal bipolar transistor on.

Embodiments have been described in the context of NPN devices. PNP structures can also be formed by reversing the dopant conductivity types in the examples provided above. However, carrier mobility is lower in PNP transistors, so they may provide a slower response.

Figure 11:
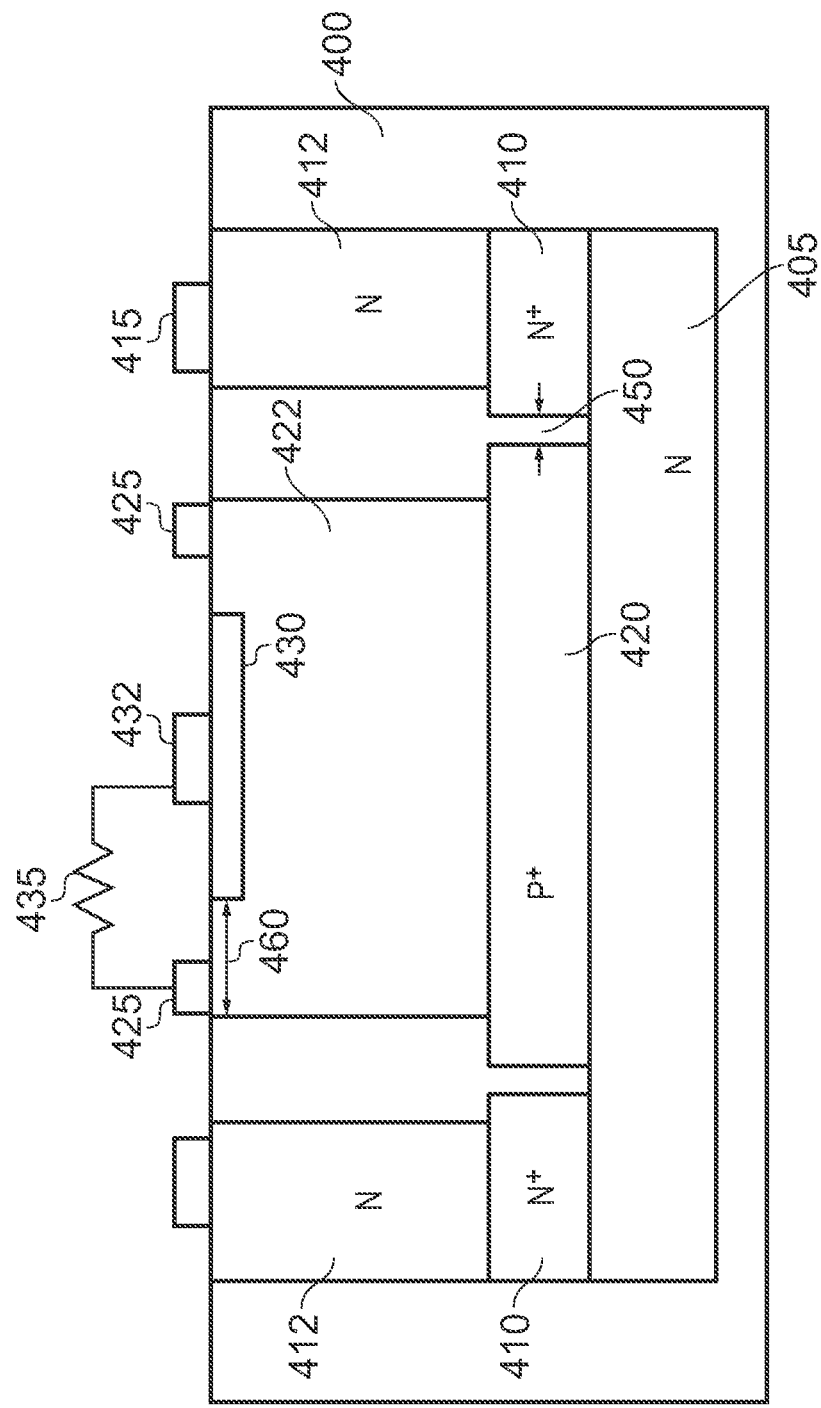
FIG. 11 shows a device structure for a further embodiment of the present invention.

So far, the structures controlling the breakdown and holding voltages have been described with respect to the devices where these structures are formed at the surface of the device. However, the principles and advantages described herein are not limited to such surface devices. FIG. 11 shows an arrangement where a subsurface or buried NPN bipolar junction determines the trigger voltage, according to one embodiment. In this arrangement, a silicon substrate 400 is provided into which an N-type layer 405 is formed so as to isolate the device from the substrate 400. An N+ collector 410 is implanted above the layer 405 and, in the finished device, connects to a collector electrode 415 via a vertically extending N-type region 412. A heavily doped P+ region 420 is also provided above the N-type layer 405, and at least part of the region 420 is horizontally aligned with the regions 410. A P-type region 422 is formed above the P+ region 420 and makes contact with a base electrode 425. An N-type region 430 that forms the emitter is deposited within the P-type region 422 and makes connection with an emitter electrode 432. A resistor 435 may optionally interconnect the base and emitter regions 420 and 430. The horizontal spacing 450 between the regions 420 and 410 is defined during the masking steps and controls the trigger voltage of the device. The horizontal distance 460 between the emitter 430 and the edge of the P-type base region 422 controls the holding voltage of the device. Thus, both of these parameters are still defined by features which the device designers could "draw," or control by mask design, although not all of these features are coplanar.

Figure 12:
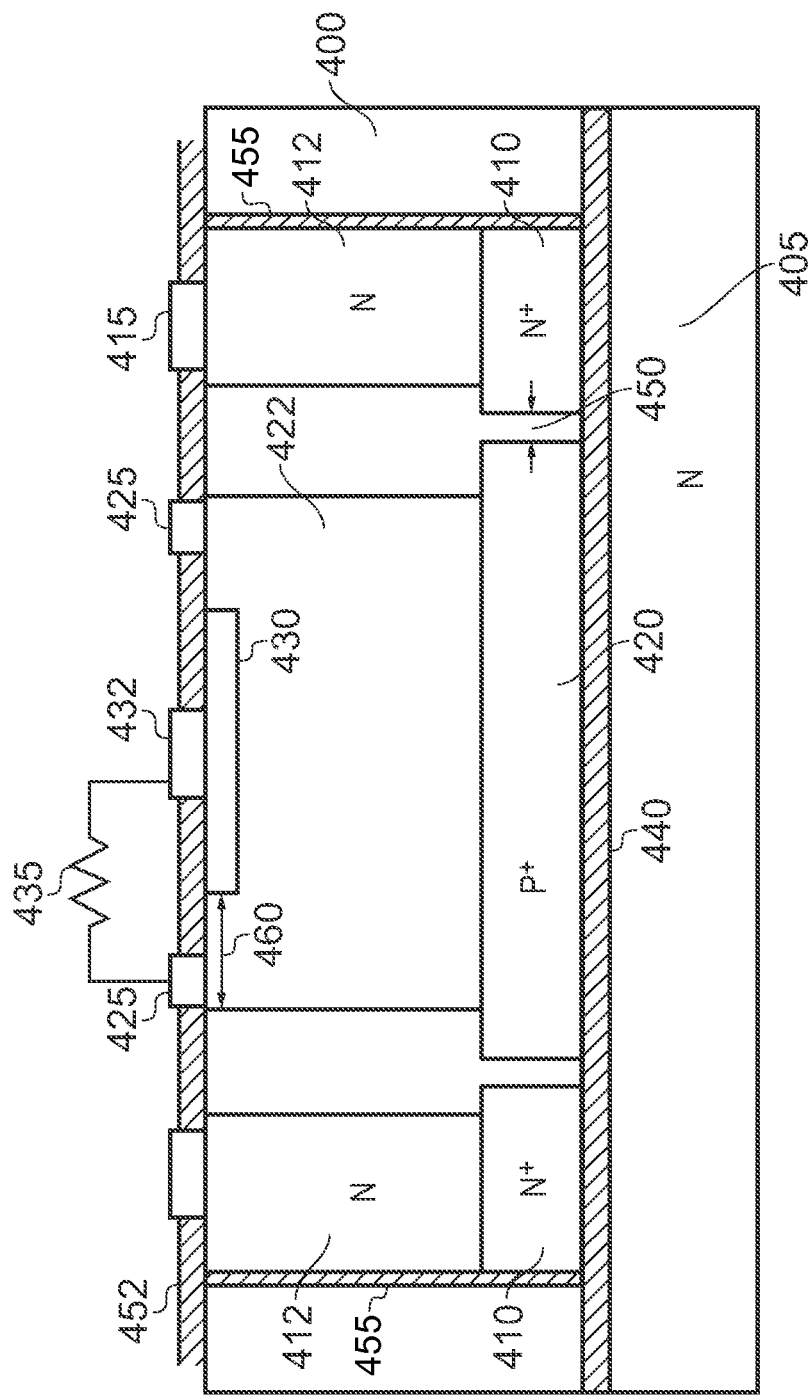
FIG. 12 shows the device structure for another embodiment of the invention.

FIG. 12 shows a further embodiment, which is similar to that shown in FIG. 11, except the horizontal NPN bipolar transistor is now isolated from the rest of the substrate by dielectric isolation comprising a silicon oxide insulating layer 440 at the base of the transistor and trench isolation 455 provided around the sides of the transistor. The choice between electrical junction isolation and dielectric isolation does not have any effect on the operation of the devices described herein. Although reference has been made to forming the semiconductor device by virtue of additional silicon epitaxial growth above an initial wafer, is also known in the art that the device structures can be formed in a single wafer with no additional silicon epitaxial growth occurring.

The arrangements shown in FIGS. 11 and 12 have the advantage that breakdown occurs away from the surface of the device, thereby preventing charge being trapped in an oxide layer 452 covering the surface of the device. This trapping can modify field gradients at the surface of the device.

It is thus possible to provide ESD protection devices where the characteristics are easily controlled by parameters at a surface (at least during device manufacture) of the device, or by control of horizontal dimensions of doped features. These features, and thus ESD protection device operational thresholds, are readily controlled by mask design.

Electrostatic protection devices as described herein can be implemented in various apparatuses. Examples of the electronic devices incorporating such ESD protection devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electrostatic discharge (ESD) protection device having mask-defined operational thresholds, wherein the ESD protection device comprises:
   a p-type semiconductor region;
   an n-type collector region positioned inside of the p-type semiconductor region;
   a p-type base region positioned inside of the p-type semiconductor region and spaced apart from the n-type collector region, wherein the p-type base region has a higher doping concentration than the p-type semiconductor region;
   an n-type emitter region positioned inside of the p-type semiconductor region and encircled by the p-type base region; and
   a p-type buried region vertically positioned beneath the p-type base region and fully overlapping the p-type base region, wherein the p-type buried region has a higher doping concentration than the p-type semiconductor region,
   wherein the n-type collector region, the p-type base region, and the n-type emitter region are configured to operate as a horizontal bipolar transistor, and wherein the p-type buried region inhibits formation of a vertical bipolar transistor.

2. The ESD protection device of claim 1, wherein a horizontal spacing between the p-type base region and the n-type collector region establishes a trigger voltage at which the ESD protection device transitions from a non-conducting state to a conducting state.

3. The ESD protection device of claim 1, wherein the n-type collector region is buried in the p-type semiconductor region, wherein at least a portion of the p-type buried region is horizontally aligned with the n-type collector region.

4. The ESD protection device of claim 3, wherein a horizontal spacing between the p-type buried region and the n-type collector region establishes a trigger voltage at which the ESD protection device transitions from a non-conducting state to a conducting state.

5. The ESD protection device of claim 3, wherein the p-type buried region and the p-type base region abut.

6. The ESD protection device of claim 1, further comprising a base electrode connected to the p-type base region, an emitter electrode connected to the n-type emitter region, and a resistor electrically connected between the base electrode and the emitter electrode.

7. The ESD protection device of claim 1, wherein the horizontal bipolar transistor is configured to turn on in response to an impact ionization current that forward biases a junction between the p-type base region and the n-type emitter region.

8. The ESD protection device of claim 1, wherein a size of the p-type base region establishes a holding voltage of the ESD protection device.

9. The ESD protection device of claim 1, wherein the p-type semiconductor region comprises a p-type well.

10. The ESD protection device of claim 9, wherein the p-type base region and the p-type buried region are separated by a portion of the p-type well.

11. The ESD protection device of claim 1, wherein the ESD protection device further comprises a field plate positioned over a portion of the p-type semiconductor region that is between the n-type collector region and the p-type base region.

12. The ESD protection device of claim 11, wherein the field plate encircles the n-type emitter region.

13. The ESD protection device of claim 1, further comprising an intrinsic region between the n-type emitter region and the p-type buried region.

14. The ESD protection device of claim 1, wherein the n-type collector region encircles the p-type base region.

15. A method of forming an electrostatic discharge (ESD) protection device, the method comprising:
   forming a horizontal bipolar transistor in a p-type semiconductor region, wherein forming the horizontal bipolar transistor comprises:
      forming an n-type collector region inside of the p-type semiconductor region;
      forming a p-type base region inside of the p-type semiconductor region and spaced apart from the n-type collector region, the p-type base region having a higher doping concentration than the p-type semiconductor region; and
      forming an n-type emitter region inside of the p-type semiconductor region and encircled by the p-type base region; and
   inhibiting formation of a vertical bipolar transistor by forming a p-type buried region vertically positioned beneath the p-type base region and fully overlapping the p-type base region, the p-type buried region having a higher doping concentration than the p-type semiconductor region.

16. An integrated circuit comprising:
   a pin; and
   a first electrostatic discharge (ESD) protection device comprising:
      a p-type semiconductor region;
      an n-type collector region positioned inside of the p-type semiconductor region;
      a p-type base region positioned inside of the p-type semiconductor region and spaced apart from the n-type collector region, wherein the p-type base region has a higher doping concentration than the p-type semiconductor region;

an n-type emitter region positioned inside of the p-type semiconductor region and encircled by the p-type base region, wherein the n-type emitter region is electrically connected to the pin; and a p-type buried region vertically positioned beneath the p-type base region and fully overlapping the p-type base region, wherein the p-type buried region has a higher doping concentration than the p-type semiconductor region, wherein the n-type collector region, the p-type base region, and the n-type emitter region are configured to operate as a horizontal bipolar transistor, and wherein the p-type buried region inhibits formation of a vertical bipolar transistor.

17. The integrated circuit of claim 16, further comprising a substrate, wherein the p-type semiconductor region comprises a p-type well separated from the substrate by an insulating material.

18. The integrated circuit of claim 16, further comprising a metal-oxide-semiconductor field-effect transistor (MOSFET) comprising a source region and a drain region, wherein the source region and the drain region share a common dopant dosage with the p-type base region.

19. The integrated circuit of claim 16, further comprising a second ESD protection device comprising an n-type collector region electrically connected to the n-type collector region of the first ESD protection device, and an n-type emitter region electrically connected to ground.

20. The integrated circuit of claim 19, wherein the first ESD protection device and the second ESD protection device are operable to provide bi-directional ESD protection.

21. The method of claim 15, wherein a horizontal spacing between the p-type base region and the n-type collector region establishes a trigger voltage at which the ESD protection device transitions from a non-conducting state to a conducting state.

22. The method of claim 15, further comprising burying the n-type collector region in the p-type semiconductor region such that at least a portion of the p-type buried region is horizontally aligned with the n-type collector region.

23. The method of claim 15, wherein forming the p-type buried region comprises forming the p-type buried region to abut the p-type base region.

24. The method of claim 15, further comprising:
    forming a base electrode connected to the p-type base region;
    forming an emitter region connected to the n-type emitter region; and
    forming a resistor electrically connected between the base electrode and the emitter electrode.

25. The method of claim 15, further comprising:
    forming a p-type well in the p-type semiconductor region such that the p-type base region and the p-type buried region are separated by a portion of the p-type well.

26. The method of claim 15, further comprising:
    forming a field plate positioned over a portion of the p-type semiconductor region that is between the n-type collector region and the p-type base region.

\* \* \* \* \*